(12) United States Patent
Tigelaar et al.

(10) Patent No.: US 6,180,424 B1
(45) Date of Patent: Jan. 30, 2001

(54) METHOD FOR IMPROVING WAFER SLEUTH CAPABILITY BY ADDING WAFER ROTATION TRACKING

(75) Inventors: Howard L. Tigelaar, Allen; Richard L. Guldi, Dallas, both of TX (US)

(73) Assignee: Texas Instruments Incorporated, Dallas, TX (US)

(*) Notice: Under 35 U.S.C. 154(b), the term of this patent shall be extended for 0 days.

(21) Appl. No.: 09/203,970

(22) Filed: Dec. 2, 1998

Related U.S. Application Data

(60) Provisional application No. 60/067,569, filed on Dec. 5, 1997.

(51) Int. Cl.[7] .................................................. H01L 21/66
(52) U.S. Cl. ................................ 438/14; 438/16; 438/17; 414/936
(58) Field of Search .................................. 438/14, 16, 17; 414/935, 936

(56) References Cited

U.S. PATENT DOCUMENTS

| 5,479,108 | * | 12/1995 | Cheng | 324/765 |
| 5,511,934 | * | 4/1996 | Bacchi et al. | 414/936 |
| 5,513,948 | * | 5/1996 | Bacchi et al. | 414/936 |
| 5,698,038 | * | 12/1997 | Guldi et al. | 134/1 |
| 6,021,380 | * | 2/2000 | Fredriksen et al. | 702/35 |
| 6,027,301 | * | 2/2000 | Kim et al. | 414/936 |

\* cited by examiner

*Primary Examiner*—Kevin M. Picardat
(74) *Attorney, Agent, or Firm*—Wade James Brady, III; Frederick J. Telecky, Jr.

(57) ABSTRACT

A method of testing semiconductor wafers wherein a cassette (3) containing a plurality of semiconductor wafers for fabrication is provided. The location and orientation of each of the wafers within the cassette is determined and at least one processing step is performed on the wafers. At least one of an alteration of the location in the cassette (5) and orientation of the wafers (7) is provided and at least one additional processing step is performed on the wafers. At least one of an alteration of the location and orientation of the wafers is provided including alteration of the location or orientation of the wafers if not yet altered. At least one like parameter of each of the wafers is measured (9). The variation across the wafer of the at least one parameter is correlated with the orientation and the location on a wafer by wafer basis and processing errors are determined from the step of correlating which can be used to alter and reduce variation in the fabrication process.

19 Claims, 1 Drawing Sheet

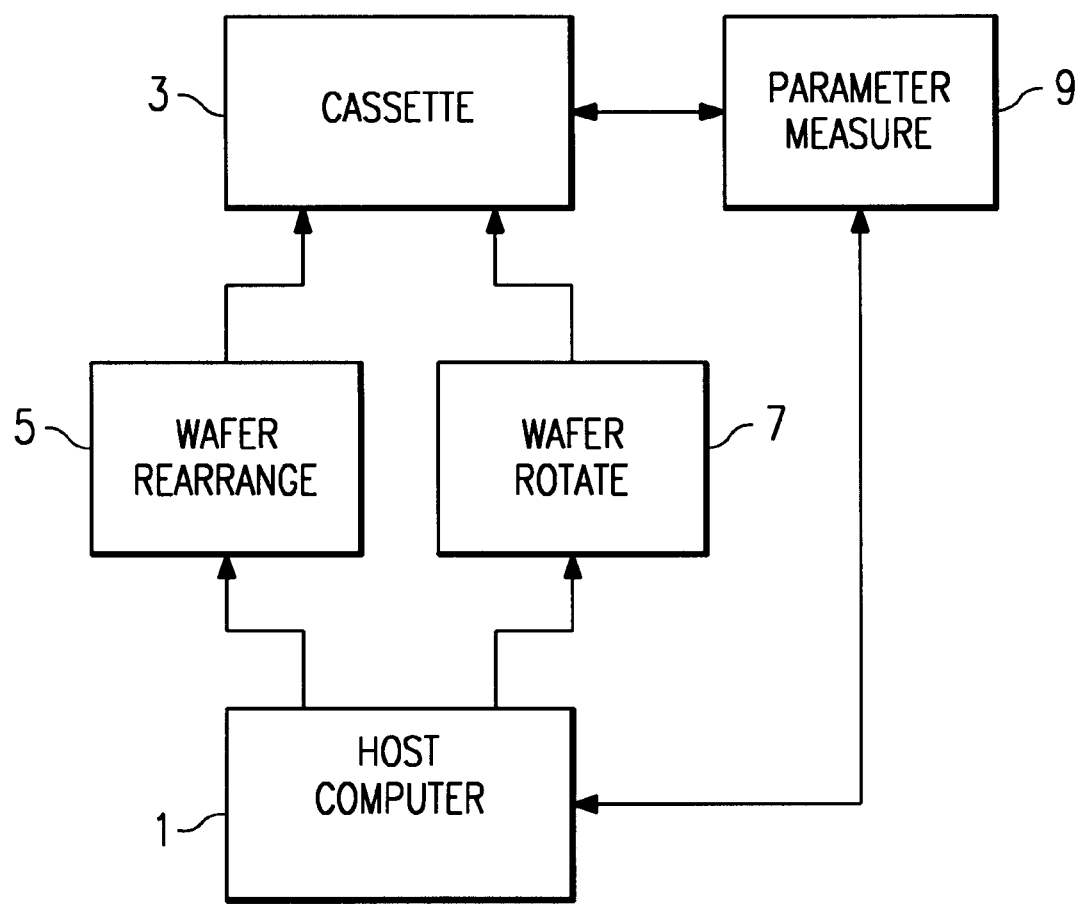

METHOD FOR IMPROVING WAFER SLEUTH CAPABILITY BY ADDING WAFER ROTATION TRACKING

This application claims priority under 35 USC 119(e)(1) of provisional application No.60/067,569 filed Dec. 5, 1997.

BACKGROUND OF THE INVENTION

1. Field of the Invention

This invention relates to a method of testing semiconductor wafers to locate problems resulting from the fabrication procedure.

2. Brief Description of the Prior Art

The fabrication procedure for fabrication of semiconductor devices generally requires several hundred steps. It is necessary that each step be repeatable and that all wafers fabricated during any step be subjected to the same conditions to the greatest extent possible in order to insure uniformity of device parameters within some predetermined window from wafer to wafer as well as to insure uniformity of parameters across a wafer.

In order to maximize such uniformity, a common technique for determining the process step responsible for a specific type of wafer to wafer parameter variation has been to process a lot of wafers through different pieces of equipment with the wafers being randomized in the loading cassette in order to randomize the order in which they are processed through various manufacturing equipments. Alternatively, wafers may be processed in a specific numeric order in specific equipments, different orders being associated with different pieces of equipment. The average parametric value or spatial variation of a parameter over the wafer is then correlated with the wafer processing sequence through each equipment in order to identify specific equipment for which the parametric variation sequence correlates with the processing order sequence. As part of this procedure, a unique readable number or bar code feature is provided on each wafer, the wafers are physically randomly rearranged from process step to process step or in some order less than every step, and the location of each wafer in the lot is read periodically by reading the readable number thereon and the location. A parameter or parameters are then checked afterwards for each wafer and correlated to the wafer order at each process step where wafers were randomized to determine any parameter differences from wafer process order and to determine how processing may have caused these parameter differences. While this method of randomizing the order of the wafers through various pieces of equipment is effective in isolating which piece of equipment is responsible for trends in the parameters from wafer-to-wafer within a lot, it does not help in determining which piece of equipment causes trends in parameters across a wafer such as a top of wafer to bottom of wafer variation or a left side of wafer to right side of wafer variation. To isolate the equipment causing this type of variation it is desirable to supplement the randomization of wafer processing order with a method to orient wafers at different angles before certain process steps so that it would be possible to explore variations in across-wafer parametrics as a function of different process steps. This has not been currently done in any systematic manner to date, such as by using specific or randomized rotational variations at designated process steps and then tracking the associated parametric variation on wafers. However, at present, there is no known procedure for automatically performing the function of wafer rotation in addition to the rearrangement of the wafer processing order with subsequent parametric tracking.

SUMMARY OF THE INVENTION

In accordance with the present invention, there is provided a procedure and system whereby wafers can not only be randomly rearranged in a lot being processed from process step to process step, but can also be rotated in accordance with a known pattern from process step to process step and be tracked automatically to determine the process step responsible for a specific type of across-wafer variation.

Briefly, the above is accomplished by providing a host computer which specifies wafer rotation instructions on a wafer by wafer basis either for predetermined lots in a specific test or for every lot at specified steps in the fabrication process. The host computer initially checks the equipment to ensure that it can accommodate rotated wafers. The host computer then downloads information to a sorter as to which wafers are to be rotated and the degree of rotation in addition to the random rearrangement of the wafers as performed in the prior art. The sorter orients the wafers in accordance with the information received from the host computer and sends the rotational information to a Wafer Sleuth computer or the like. The Wafer Sleuth computer finds parametric commonality to wafer orientation.

More specifically, a host computer is provided which controls the testing operation in accordance with the present invention. Initially semiconductor wafers are loaded into a cassette in standard manner for fabrication with the host computer tracking the location and rotational orientation of each wafer initially placed within the cassette. After one or more processing steps, as determined by the host computer, the wafers are rearranged within the cassette under control of the host computer with the host computer tracking the new location of each wafer within the cassette. Each wafer is also rotated within the cassette by a rotating tool under control of the host computer after one or more processing steps, such rotation being generally 90, 180 or 270 degrees for simplicity, though other angular arrangement are contemplated and can be used. Wafer rotation for each wafer is tracked by the host computer with such wafer rotation being concurrent with wafer rearrangement or independent of wafer rearrangement. Wafer rearrangement and wafer rotation can independently take place after each processing step or periodically according to programs set up in the host computer and can be concurrent or independent of each other. After all processing steps have been completed for wafer fabrication and the components on the wafer have been fabricated, one or more parameters of the fabricated components including components specifying spatial variation of a parameter measured with respect to the notch are tested in standard manner with the test results sent to the host computer on a wafer by wafer basis for correlation with the location and orientation of each wafer during processing to locate fluctuation of parameters from wafer to wafer in the fabrication process and to determine process locations or operations which may require correction.

BRIEF DESCRIPTION OF THE DRAWING

The FIGURE is a schematic diagram of a system in accordance with the present invention.

DESCRIPTION OF THE PREFERRED EMBODIMENT

Referring to the FIGURE, there is shown a host computer 1 which controls the testing operation in accordance with the present invention. Initially semiconductor wafers are loaded into a cassette 3 in standard manner for fabrication with the host computer 1 tracking the location 5 and rotational orientation 7 of each wafer initially placed within the cassette. After one or more processing steps, as determined by the host computer 1, the wafers are rearranged within the cassette 3 by a robot or the like 5 as is known in the art under control of the host computer with the host computer tracking the new location of each wafer within the cassette. Each wafer is also rotated within the cassette 1 by a rotating tool 7 under control of the host computer 1 after one or more processing steps, such rotation being generally 90, 180 or 270 degrees for simplicity. Wafer rotation for each wafer at all steps in the fabrication procedure is tracked by the host computer 1 with such wafer rotation being either concurrent with wafer rearrangement or independent of wafer rearrangement by the robot 5. Wafer rearrangement and wafer rotation can take place independently after each processing step or periodically according to programs set up in the host computer 1 and can be concurrent and/or at different steps in the processing cycle. After all processing steps have been completed for wafer fabrication and the components on the wafer have been fabricated, one or more parameters of the fabricated components including components specifying spatial variation of a parameter measured with respect to the notch are tested in standard manner with a parameter measure system 9 with the test results being sent to the host computer on a wafer by wafer basis for correlation with the location and orientation of each wafer during processing to locate fluctuation of parameters from wafer to wafer (correlated to wafer location) or fluctuation of parameters across wafers (correlated to rotation) in the fabrication process and to determine process locations or operations which may require correction due to is analysis of such fluctuations on a rotational and rearranged wafer basis.

Though the invention has been described with reference to a specific preferred embodiment thereof, many variations and modifications will immediately become apparent to those skilled in the art. It is therefore the intention that the appended claims be interpreted as broadly as possible in view of the prior art to include all such variations and modifications.

What is claimed is:

1. A method of testing semiconductor wafers which comprises the steps of:
    (a) providing a plurality of semiconductor wafers for fabrication;
    (b) determining the orientation of each of said wafers;
    (c) performing at least one processing step on said wafers;
    (d) providing an alteration of the orientation of said wafers;
    (e) performing at least one additional processing step on said wafers; and
    (f) measuring at least one like parameter of each of said wafers.

2. The method of claim 1 further including the step of correlating said variation in at least one parameter with said orientation on a wafer by wafer basis.

3. The method of claim 1 further including the steps of providing a computer, said step of providing a predetermined alteration being under control of said computer.

4. The method of claim 2 further including the steps of providing a computer, said steps of providing a predetermined alteration, correlating and determining at least one of processing errors or processing variations being performed by said computer.

5. The method of claim 1 wherein said step of correlating includes analysis of said alteration of orientation on a wafer by wafer basis.

6. The method of claim 2 wherein said step of correlating includes analysis of said alteration of orientation on a wafer by wafer basis.

7. The method of claim 3 wherein said step of correlating includes analysis of said alteration of orientation on a wafer by wafer basis.

8. The method of claim 4 wherein said step of correlating includes analysis of said alteration of orientation on a wafer by wafer basis.

9. The method of claim 1 wherein said wafers are disposed in a cassette, further including the step of determining the location of each of said wafers in said cassette; performing at least one processing step on said wafers; providing a predetermined alteration of the location of said wafers; performing at least one additional processing step on said wafers; and measuring said at least one like parameter of each of said wafers.

10. The method of claim 9 further including the step of correlating said at least one parameter with said location on a wafer by wafer basis and determining at least one of processing errors or processing variations from said step of correlating.

11. The method of claim 9 further including the steps of providing a computer, said step of providing a predetermined alteration of the location being under control of said computer.

12. The method of claim 10 further including the steps of providing a computer, said steps of providing a predetermined alteration of the location, correlating and determining processing errors being performed by said computer.

13. The method of claim 9 wherein said step of correlating includes analysis of said alteration of orientation of a wafer by wafer basis.

14. The method of claim 10 wherein said step of correlating further includes analysis of said alteration of location of a wafer by wafer basis.

15. The method of claim 11 wherein said step of correlating further includes analysis of said alteration of location of a wafer by wafer basis.

16. The method of claim 12 wherein said step of correlating further includes analysis of said alteration of location of a wafer by wafer basis.

17. A method of testing semiconductor wafers which comprises the steps of:
    (a) providing a cassette containing a plurality of semiconductor wafers for fabrication within said cassette;
    (b) determining the location and orientation of each of said wafers within said cassette;
    (c) performing at least one processing step on said wafers;
    (d) providing at least one of an alteration of the location and orientation of said wafers;
    (e) performing at least one additional processing step on said wafers;
    (f) providing at least one of an alteration of the location and orientation of said wafers including alteration of the location or orientation of said wafers if not yet altered; and
    (g) measuring at least one like parameter of each of said wafers.

18. The method of claim 17 further including the step of correlating said at least one parameter with said orientation and said location on a wafer by wafer basis and determining at least one of processing errors or processing variations from said step of correlating.

19. The method of claim 1 wherein said step of measuring is across each of said wafers.

* * * * *